United States Patent [19]

Acampora

[11] Patent Number: 4,542,475
[45] Date of Patent: Sep. 17, 1985

[54] SAMPLED DATA FILTER SYSTEM AS FOR A DIGITAL TV

[75] Inventor: Alfonse Acampora, Staten Island, N.Y.

[73] Assignee: RCA Corporation, Princeton, N.J.

[21] Appl. No.: 443,928

[22] Filed: Nov. 23, 1982

[51] Int. Cl.[4] .......................... G06F 7/38; H04N 5/14
[52] U.S. Cl. ...................................... 364/724; 358/37
[58] Field of Search ................. 364/724, 825; 358/36, 358/37; 333/165

[56] References Cited

U.S. PATENT DOCUMENTS

| | | | |
|---|---|---|---|
| 3,938,181 | 2/1976 | Avins | 358/37 |
| 3,983,576 | 9/1976 | Shanly et al. | 358/37 |
| 4,106,102 | 8/1978 | Desblache | 364/724 |
| 4,136,398 | 1/1979 | Eggermont | 364/724 |
| 4,290,139 | 9/1981 | Walsh | 364/724 |
| 4,314,277 | 2/1982 | Pritchard et al. | 364/724 |
| 4,321,686 | 3/1982 | Horna | 364/724 |
| 4,350,995 | 9/1982 | Harlan | 358/37 |
| 4,417,317 | 11/1983 | White et al. | 364/825 |
| 4,430,721 | 2/1984 | Acampora | 364/724 |

Primary Examiner—James D. Thomas
Assistant Examiner—Dale M. Shaw
Attorney, Agent, or Firm—E. M. Whitacre; P. J. Rasmussen; E. P. Herrmann

[57] ABSTRACT

Low pass sampled data filters tend to produce pre- and post- over/undershoots in the output signal in response to input signal transitions. These over/undershoots or sequence of artifacts are eliminated in the present system by the following method. The input signal is monitored for transitions exceeding an amplitude which tends to generate objectionable artifacts. The values of such transitions are stored and applied to a plurality of weighting circuits to generate a plurality of signal values corresponding to respective ones of the sequence of artifacts. The weighted samples are selectively combined with the filter output samples in time correspondence with the occurrence of the output artifacts to cancel the effects of the artifacts.

10 Claims, 13 Drawing Figures

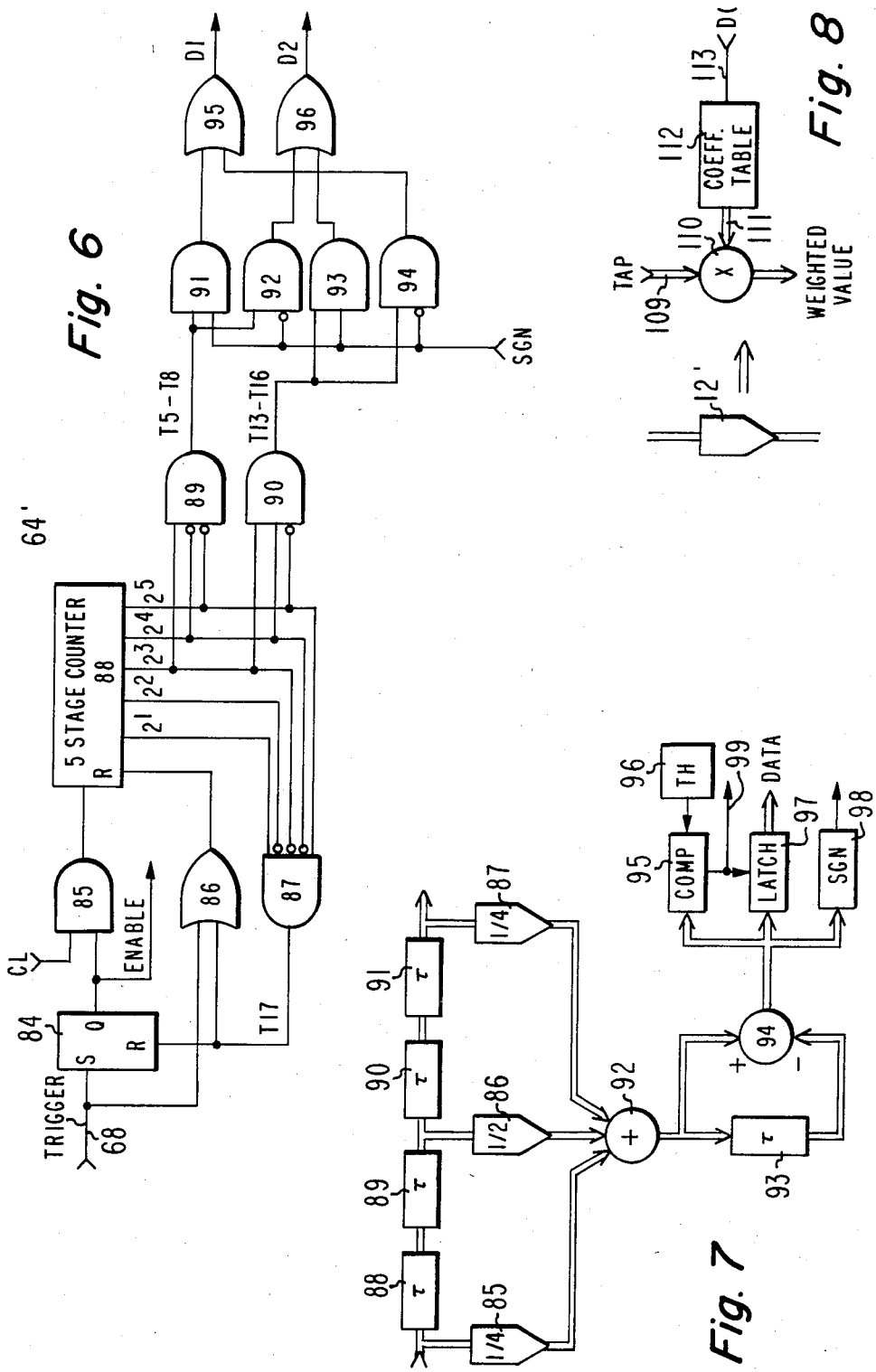

SAMPLED DATA FILTER SYSTEM AS FOR A DIGITAL TV

BACKGROUND OF THE INVENTION

This invention relates to sampled data filters and more particularly to apparatus for reducing pre- and post-signal overshoot in the filter output response attendant sharp signal transitions applied to such filters.

Typically sampled data filters operate by successively producing weighted sums of successive groups of input samples. This is accomplished in an output weighted filter, for example, with a delay element having a plurality of output taps at which successive signal samples delayed by successively greater delay periods can be accessed. The samples from the various taps are weighted and then added together to provide the filtered replica of the input sample. Nominally, the filtered replica of an input sample x(n) presently within the confines of the filter is the weighted sum of input samples x(n+i) occurring in time before the sample x(n) and input samples x(n−i) occurring in time after the sample x(n). If the particular sample x(n−j) represents a large amplitude transition, it will readily be appreciated that it can significantly influence the value of the filtered output sample y(n). In other words, it is a characteristic of the output signal of the sampled data filter to undergo output signal changes responsive to input changes in advance of the filter group delay. Depending on the design of the particular filter, the artifacts produced by the anticipatory nature of the sampled data filter may be particularly objectionable. For example, if the filter is designed with symmetrical tap weights about the filter center point and includes both positive and negative tap weights, a positive going signal transition x(n−j) may produce a negative going filter output transition (undershoot) in advance of the filtered replica of the transition and an overshoot subsequent to the filtered replica of the transition. Conversely a negative input transition may create a pre-overshoot and a post-undershoot. The magnitude and duration of the under and overshoots can be readily calculated for any given input transition knowing the values of the filter tap weights. It is an object of the present invention to reduce output signal artifacts due to particular input signal transitions in sampled data filters.

SUMMARY OF THE INVENTION

The present invention is a sampled data filter of either the input weighted or the output weighted type and which is subject to producing pre- and post-overshoots in the filtered replicas of input signal transitions. A transition detector is coupled to the filter input signal to generate control pulses whenever an input signal transition exceeds a predetermined threshold value. In one embodiment, the difference in amplitude of successive input signal samples are determined and responsive to the control pulses are stored in a latch. The difference values are weighted and added to the filter output signal at the appropriate time to cancel the pre-and post-over-/undershoot in the filtered replicas of input signal transitions which exceed the threshold.

In a second embodiment, the control signals from the transition detector sequentially modify the weighting values of particular ones of the filter tap weighting elements. The tap contribution, to the output sum, which tends to produce the over/undershoot is temporarily eliminated or reduced.

BRIEF DESCRIPTION OF THE DRAWINGS

FIG. 6 is a logic schematic diagram of circuitry for generating control signals for application to e.g. the FIG. 5 circuit;

FIG. 7 is a block diagram of circuitry for detecting signal transitions; and

FIG. 8 is a block diagram of a weighting circuit with facility for changing weighting coefficients.

DETAILED DESCRIPTION OF THE INVENTION

Figure 1:
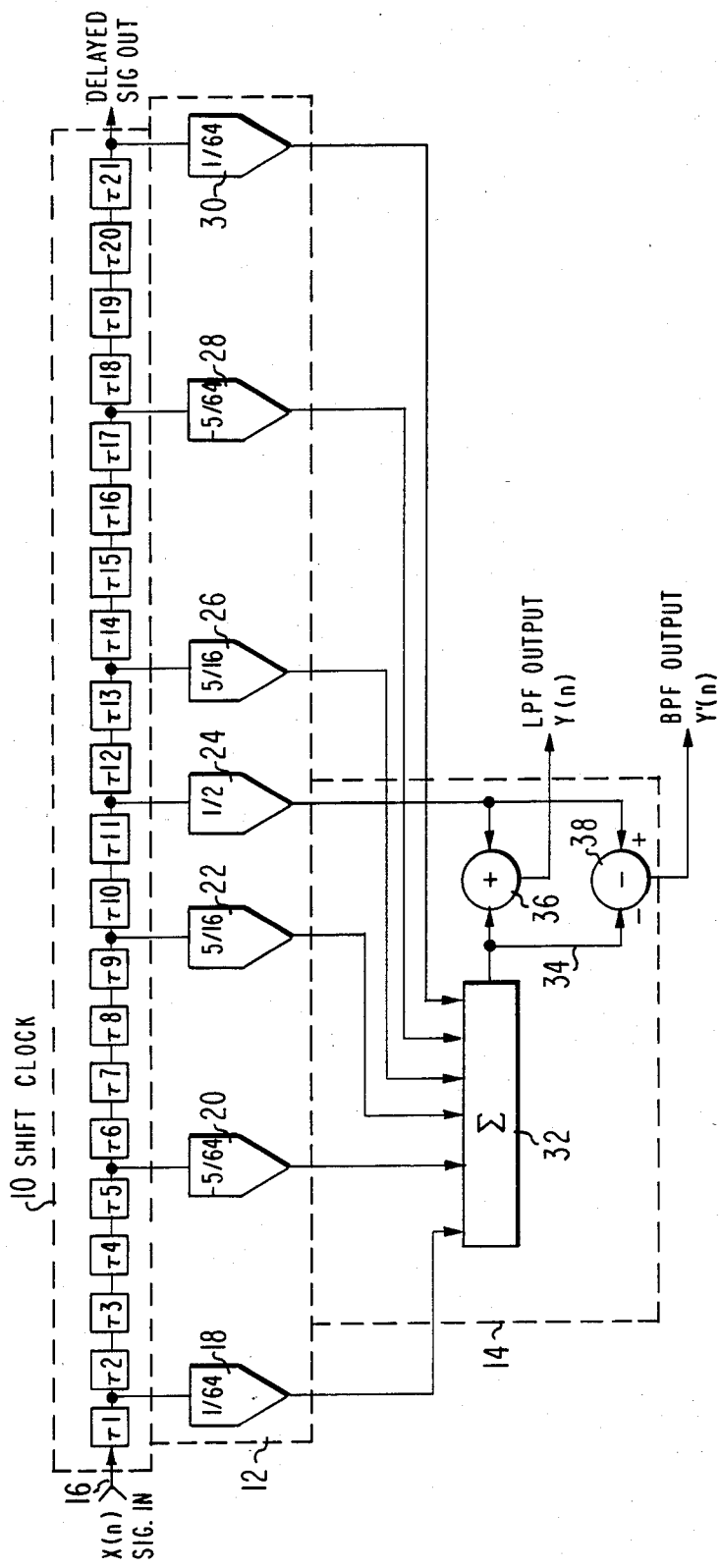
FIG. 1 is a block diagram of an output weighted sampled data finite impulse response filter which is arranged to produce both a low pass transfer function and a bandpass transfer function from separate output terminals.

Referring to FIG. 1, an exemplary sampled data finite impulse response or FIR filter is shown for application to TV chrominance signal processing. The filter may be designed to process either analog or digital signals. For the analog version, the delay elements (10) may be shift register stages, for example, stages of a CCD shift register. The weighting circuits (12) may be analog multipliers and the summing circuit (14) a resistor matrix. A digital realization of the filter, on the other hand, might employ bistables for delay elements (10), binary multipliers, e.g. shift and add circuits for the weighting elements (12) and binary adders for the summing circuit (14). The primary difference between the analog and digital sampled data filters is that the former operates on discrete samples of input signal parameters, while the latter operates on quantized representations of like samples in binary number form. For like weighting coefficient values both types of filters have like transfer functions.

The transfer function of a sampled data FIR filter is determined by the placement of the shift register taps and the coefficient values chosen for the tap weights and may be expressed by the equation:

$$H(Z) = \sum_{i=0}^{N} a_i Z^{-i}$$

where Z indicates the conventional Z-transform and the $a_i$ factors are the coefficient values at the ith tap. Stages that have no taps contribute nothing to the sum in equation (1).

The FIG. 1 filter contains fractional weighting coefficients which add up to unity. In the figure, the weighted samples from taps at stages 1, 5, 9, 13, 17 and 21 are summed in the summing element 32. This sum is then added to the weighted sample from center delay stage 11 in ADDER 36 to provide the low pass filtered samples y(n). In addition, the sum from element 32 is subtracted from the weighted sample from center tap 11 to provide the band passed filtered samples y'(n).

Figure 2:
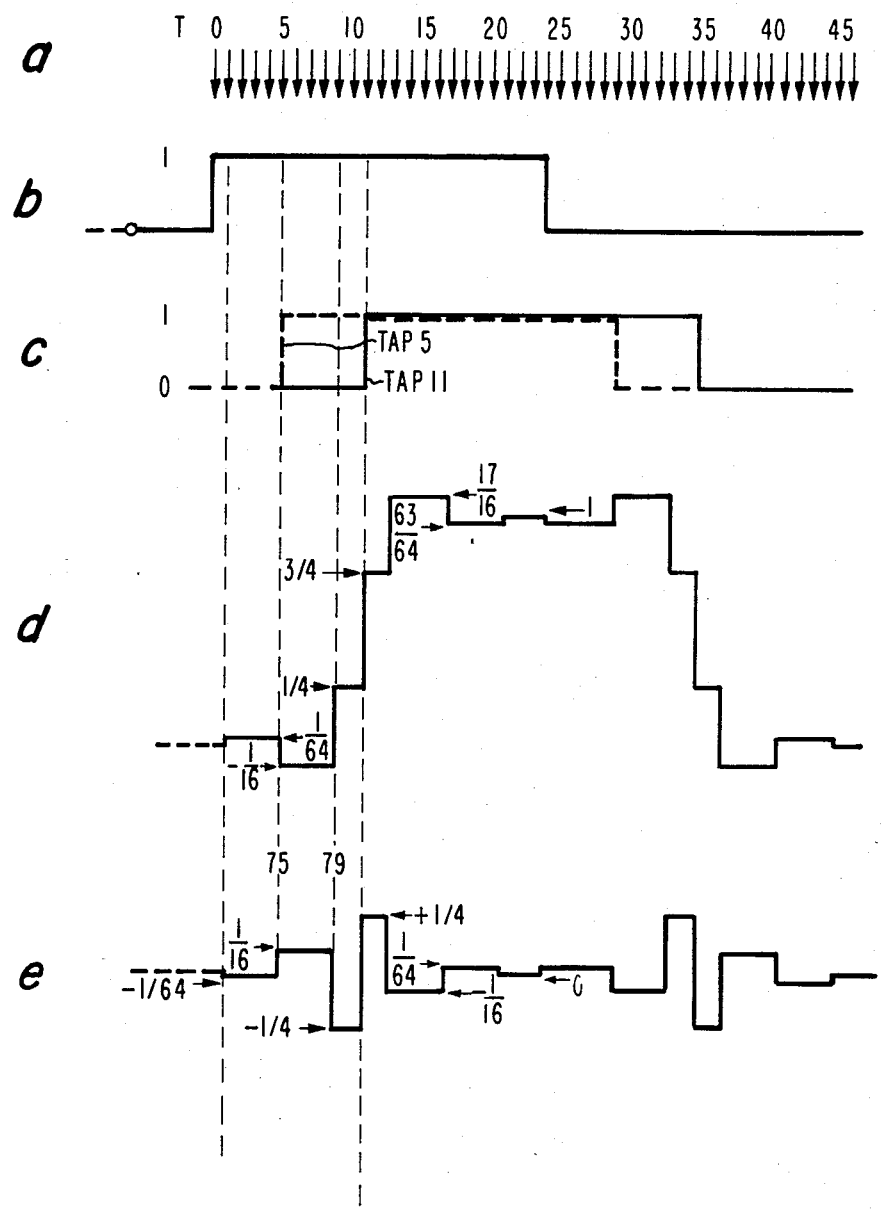
FIGS. 2a-2e are a waveform timing diagram of the FIG. 1 output response for a stepped input signal.

FIG. 2 shows the time-amplitude response of the FIG. 1 filter for a signal pulse applied to the filter input. FIG. 2a indicates the sample points and the times at which the delay elements shift data to successive stages. FIG. 2b is the signal applied to the filter input which for convenience is shown as a continuous signal. FIG. 2c shows the time shifted input signal at taps 5 and 11 which signals are delayed by five and eleven sample time periods respectively from the input signal. FIG. 2d is the low pass filter output response y(n) and FIG. 2e is the bandpass filter output response y'(n).

The input signal is presumed to be zero valued from time T0 leftward, to have a value of "1" from time T0 to T24, and then to return to a zero value. One sample period after the input signal transition from zero to "1" the signal value at tap 1 undergoes a like transition. Five sample periods after the same transition occurs at the filter input, the signal value at tap 5 undergoes a like transition, etc. At time T0, the delay stages $\tau1-\tau21$ are all presumed to contain zero valued signal samples. Therefore, the weighted values of the samples at stages 1, 5, 9, 11, 13, 17 and 21 must also be zero valued and the sum of the weighted samples is also zero. At time T1, tap 1 (the output of delay stage $\tau1$) acquires a signal value of 1. Weighting element 18 divides the tap 1 signal by 64 and applies the weighted sample to the summing circuits 32 to ultimately produce an output signal y(n) equal to 1/64 as indicated at T1 in FIG. 2d. The output at tap 1 remains at the 1 level for 24 clock cycles (the width of the input pulse) and therefore weighting circuit 18 contributes a value of $+1/64$ to the output signal y(n) from time T1 to time T25. At time T5 the leading edge of the input pulse arives at the second tap (between delay stages $\tau5$ and $\tau6$), is weighted by the factor ($-5/64$) by element 20 and the weighted signal is applied to the summing circuit 32. At time T5 the filter output is effectively the sum of the contributions from the first and second taps i.e. $y(n)_{T5}=1/64(1)-5/16(1)=-1/16$ as shown in FIG. 2d, since the signal values at the remaining taps are currently still zero. The second tap contributes to the output signal y(n) from time T5 to T30. In the foregoing manner, each of the taps sequentially contributes to the output signal producing the amplitude-time waveform indicated in FIG. 2d.

The negative going output response (pre-undershoot) from time T5 to T9 preceeds the output replica of the input transition, i.e. the output undershoot anticipates the output transition. The filter produces a post-overshoot (similar to the undershoot) from time T13 to T17. In like manner, the filter produces a pre-overshoot and post-undershoot for negative going input transitions e.g. at times T29-T33 and T37-T41. For a filter with symmetrical tap weights the overshoots for like positive and negative going input transitions will be equal as will the undershoots.

The bandpass filter response shown in FIG. 2e contains pre- and post-under and overshoots which are complementary to those in the low pass response. Thus, if the low pass and bandpass responses are added together during the time an input transition is being shifted through the filter register, the over and undershoots will be cancelled. To faithfully reproduce the input signal transition and the signal immediately preceding and trailing the input transition, the bandpass response must be added to the low pass response from time T1 to time T21 which corresponds to the length of the filter delay register. The effect of adding the two filter responses is to create an all pass filter for the interval that they are combined. This is tantamount to removing the filter from the system for the duration of the interval and may not be tolerable for many applications.

Consider the situation in which the signal to be low pass filtered is the combed chrominance component of baseband composite TV video signal including the low frequency vertical detail resulting from the interline combing process. Consider also that the low pass transfer function is designed to extract the vertical detail, i.e., eliminate the chrominance signal. In this environment, it would be undesirable to produce an all pass function at least when the chrominance signal is strong. However, since the chrominance signal is an amplitude and phase modulated subcarrier (3.58 MHz) with relatively small sidebands, the bandpass response may be applied to a narrow band notch filter to remove the 3.58 MHz subcarrier and then added to the low pass response to compensate the over and undershoots.

Figure 3:
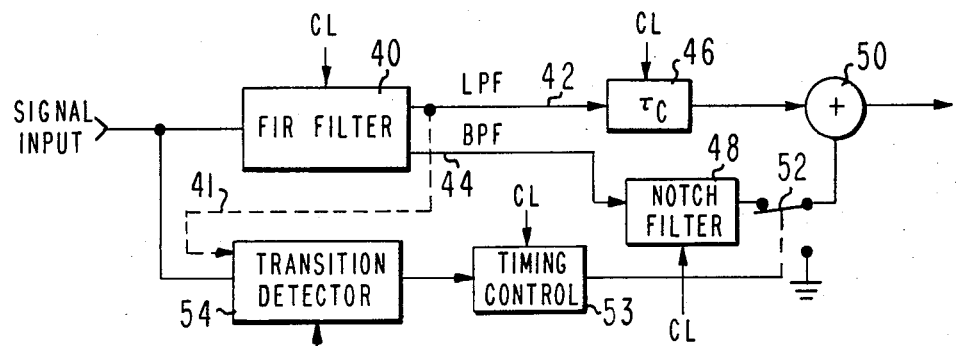
FIGS. 3 and 4 are block diagrams of FIR filter systems with provisions for cancelling input signal transition induced artifacts at the filter output terminal.

FIG. 3 shows in block diagram form circuitry for eliminating pre- and post-over/undershoots produced in an FIR filter. Element 40 is an FIR filter, for low pass filtering a combed chrominance video signal, for example, of the type illustrated in FIG. 1 and which produces a low pass filter response (42) and a bandpass filter response (44). The low pass and bandpass output responses have complementary over/undershoot characteristics. The bandpass response is applied to notch filter 48 which removes 3.58 MHz signal frequency components. The low pass response 42 is applied to element 46 which delays the signal applied thereto by an amount $\tau_c$ corresponding to the group delay of the notch filter 48. The output of delay element 46 is applied to an ADDER circuit 50 and the output of the notch filter 48 is applied to ADDER 50 via the switch 52. When the switch is closed the low pass and notched bandpass filter responses are summed in ADDER 50. A transition detector 54 coupled to receive the filter input signal determines the occurrence of input signal transitions which are of sufficient amplitude to create undesirable artifacts (over/undershoots) in the filter output response. The transition detector on detecting such a transition triggers a timing circuit 53 which closes switch 52 at the appropriate time to effect cancellation of the artifacts. The timing circuit may be designed to effect closure of the switch 52 for the entire duration that the transition is in the filter or only for selected intervals thereof. Referring back to FIG. 2, the timing circuit may be designed to close the switch only during the times T5-T9 or times T5-T9 plus T13-T17 or times T5-T17 or some other combination depending on the ultimate manifestation of the filter produced artifact. Note, that if each switch closure is for a short enough duration, the notch filter in the bandpass signal chain may be unnecessary. Note also, that correction of artifacts in the bandpass response can be similarly eliminated by the selective addition of the low pass response to the bandpass signal. Elements 54, 53 and 48 will be discussed in more detail in connection with FIGS. 7 and 6.

Since input transitions will be replicated in filtered form at connection 42, they may be detected at this point. Broken line 41 indicates this possible connection to the transition detector. In this embodiment, transitions which would normally be substantially attenuated by the filter response and which otherwise might be detected by the transition detector are automatically precluded from doing so. The transition detector may also be coupled to the bandpass response at connection 44 providing the chrominance components of the signal are first filtered out ahead of the transition detector input terminal. In these latter two embodiments, additional delays may have to be inserted between connections 42 and 44 and the summing circuit to compensate for the response time of the detection and timing control circuits.

Referring again to FIG. 2, it will readily be appreciated that if the value of an input transition and the time of its occurrence is known, the filter response of a particular FIR filter to the transition is precisely predictable. For example, if an input transition occurs at time T0 and we know that the transition has an amplitude excursion of 1, we can immediately predict that the FIG. 1 filter low pass response will undergo a negative 1/16 undershoot at time T5. It is therefore possible to generate compensating signals directly from the input signal transition to counteract undesirable over/undershoots.

Figure 4:
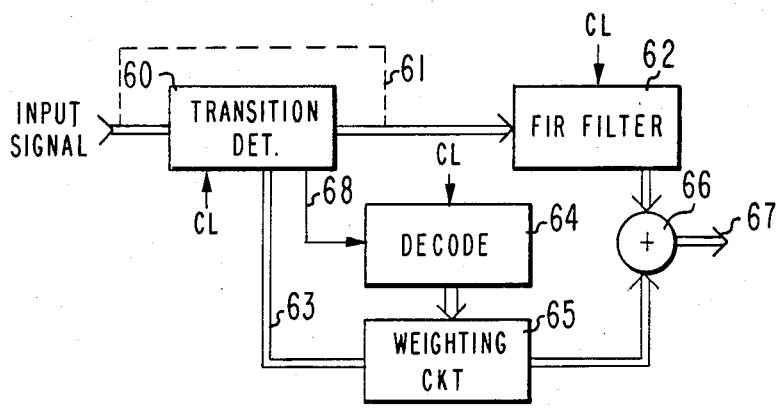

FIG. 4 is a block diagram of circuitry for compensating undesirable output artifacts in a FIR filter output response by continuously sampling the input signal and selectively adding weighted portions of the input signal to the filter output response (FIGS. 4–8 are drawn as digital realization of the particular circuits. In the figures, the double lined connections represent parallel bit lines and the single line connections represent single conduction paths). In FIG. 4 signal to be filtered is applied to a transition detector 60 which compares successive input samples and produces a control or trigger signal on connection 68 whenever the difference between successive samples exceed a predetermined value. The difference in value of the successive samples is indicative of the value of the signal transition and this value is produced on connection 63. The difference value is applied to weighting circuit 65 which, responsive to control signals from decoder 64, successively weights the difference value with differing weights to create a time varying signal having the appropriate amplitude and polarity to cancel artifacts in the output response of an FIR filter due to corresponding input signal transitions. The output response of weighting circuit 65 is applied to one input of an ADDER circuit 66. The output signal from FIR filter 62 which is processing the signal applied to transition detector 60 is applied to a second input of ADDER circuit 66, the output of which is a corrected filter signal. The broken line 61 in the figure indicates that the input signal connection to the filter 62 need not be through a serial connection with detector 60.

Figure 5:
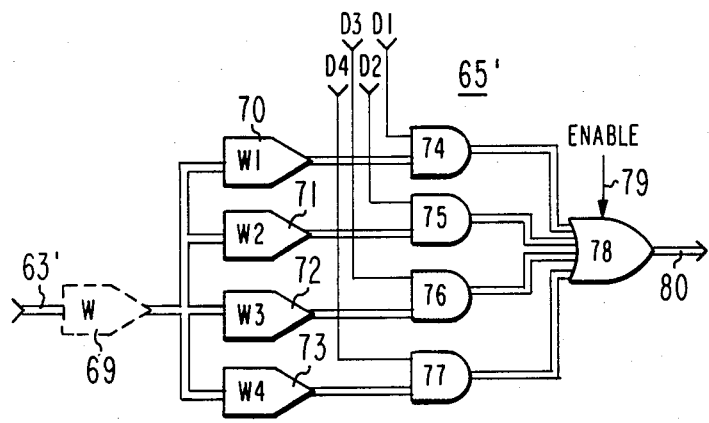
FIG. 5 is a block diagram of circuitry for generating compensating signals for cancelling artifacts in the FIG. 4 filter output samples.

FIG. 5 is an example of a weighting circuit which may be implemented for element 65 in FIG. 4. In FIG. 5, the difference value which is related to the amplitude of a particular input signal transition is applied to connection 63. (Element 69 is to be considered bypassed in this first embodiment of FIG. 5 and will be described subsequently.) This value is then weighted by the factors W1–W4 in circuit elements 70–73 which are connected in parallel. The weighted values are gated via the AND circuits 74–77 and OR circuit 78 to the output connection 80. The AND gates 74–77 are respectively controlled by decoded input signals on connections D1–D4. A logic "1" applied to a decoded input connection will enable the respective AND gate to pass the weighted sample to OR circuit 78. In addition, OR circuit 78 has an enable input to condition it to pass signal only when an enable signal is produced by the decoder. The AND gates 74–77 can be enabled in any order though only one may be enabled for each sample period. On the other hand, if the OR circuit 78 were replaced by a summing circuit, any combination of the AND gates 74–77 could be simultaneously enabled to provide a larger variety of weighted compensation signals.

An alternative to the FIG. 5 circuit may comprise a single weighting circuit with facility for changing its weighting coefficient. If the coefficient were supplied from a read only memory (ROM) for example, the decode signals would be directed to address the ROM in the sequence designed to generate the cancellation signals.

Referring again to FIG. 2d, presume that it is desired to pass the transition substantially without pre-or post-overshoots i.e. without the negative 1/16 output segment from T5 to T9 or the excess 1/16th signal from T13 to T17. To eliminate these artifacts, the weighting circuit 65 need have only two weighting elements—one (e.g. 70) producing a signal equal to 1/16th of the input transition and the other (e.g. 71) producing a signal equal to $(-)1/16$th of the input transition. (Actually, only one weighting element and a signal complementing element is required in this simplified example).

Consider element 62 of FIG. 4 to produce the step function response illustrated in FIG. 2d. To eliminate only the $(-)1/16$th artifacts, the decoded inputs D1–D4 would be addressed as follows. From time T0 to T5 inputs D1–D4 are held low. From time T5 to T9, D1 is held high and D2–D4 are held low. AND gate 74 passes the $+1/16$th signal from weighting circuit 70 which when added to the filter output signal cancels the $(-)1/16$th segment of the output response. From time T9 to T13, inputs D1–D4 are again all held low. Then from time T13 to T17 input D2 is held high and D1, D3–D4 are held low. AND gate 75 passes the $(-)1/16$ transition signal from weighting circuit 71 which when added to the filter output response eliminates the post transition overshoot. To compensate the filter output response associated with the negative going input transition, which for the response shown is symmetrical with the positive going response, first AND gate 75 would be enabled for the four sample periods (T29–T32) occurring four sample periods after the transition occurred at the filter input terminal (T24). Then AND gate 74 is enabled for the four sample periods (T37–T40) occurring thirteen sample periods after the transition occurrs at the filter input.

The filter response of FIG. 2d illustrates the step function response of a seven tap filter whose weights add to a total of one. The filter, in response to a transition develops six output segments between T0–T21 before the "true" output value is produced at time T21. By expanding the FIG. 5 weighting circuit to have six weighting elements and six AND gates, each of the six output signal segments may be compensated.

In the foregoing, it was presumed that all of the compensating signals were developed from the same sample difference value applied to connection 63'. The difference value was determined at the input transition and thus should be directly related to the required signal correction values. Note also that the discussion has been in terms of the input step response of FIG. 2b. Normally the input signal would be prefiltered to prevent aliasing by the sampling process. Thus, in practice, input transitions would occur as stairstep amplitudes. The stepped input transitions are reflected in the filter output response. As a result, the multi-sample output segments (e.g. T5-T9) cannot be exactly corrected by adding a constant compensating signal to the output response over the four sample segment. However, the output response can be improved by adding, in complementary fashion, a constant value related to the average value of the transition. This tends to shift the average value of the output response of each segment. In our example, the weighting circuit would contain a weighting element of value (+)1/32 for correcting the T5-T9 signal segment. A second approach is to successively increase the weighting value from sample to sample based on statistically determined input characteristics. Consider an input transition from zero to the value 1 over four sample periods and that a value of 1 is applied to connection 63' of the FIG. 5 circuit. The input transition (in sampled data form) occupies four sample periods and has successive amplitude steps of $\frac{1}{4}$, $\frac{1}{2}$, $\frac{3}{4}$ and 1. These steps may be accommodated for in the weighting circuit by serial imposition of an adaptive weighting element 69 in the input connection 63. During each segment of the filter output response, the element 69 is stepped via decoding circuitry through the weighting factors $\frac{1}{4}$, $\frac{1}{2}$, $\frac{3}{4}$ etc. This produces compensating values which are based on a measured value and tend to track the actual input slope. For the general case the weighting factors for element 69 would be chosen to comport with the average of the transitions expected to occur.

FIG. 6 is a partial schematic of exemplary decoder circuitry for controlling the weighting circuit 53 where it is only desired to correct the T5-T9 and T13-T17 artifacts in the foregoing example. For this example, only decoding signals for the D1 and D2 decode input lines need be generated. However, it will be readily appreciated that further combinatorial logic may be coupled to the counter output signals to develop further decoding signals.

In FIG. 6, a trigger signal on input connection 68' from the transition detector sets a flip flop 84 and resets a five stage counter 88 to zero. It will be presumed that the trigger is timed relative to the corresponding input transition and the filter clock pulses so that the counter begins its count coincident with the leading edge of the transition appearing at the first tap weighting circuit 18. The flip flop 84 enables AND gate 85 to apply clock pulses at the sample rate to the counter input. The counter divides the input clock by binary increments to generate output signals $2^1-2^5$ corresponding to the clock signal divided by 2, 4, 8, 16 and 32. A five input AND gate 87 connected to the five counter output terminals produces a reset pulse on the 17th pulse to reset the flip flop 84 and the counter 88 and thereby the decoder. Note that the trigger input is connected to the transition detector through the OR circuit 86 so that a trigger pulse occurring within 16 clock pulses of a previous trigger pulse will reset the counter. The effect is that the latter transition overides the compensating signals of an earlier transition.

AND gates 89 and 90 coupled to the $2^3-2^5$ output terminals of counter 88 both generate output pulses which are four clock periods in width. The leading edge of the pulse produced by AND gate 89 coincides with the time T5 (FIG. 2a) and the leading edge of the pulse produced by the AND gate 90 coincides with the time T13 in FIG. 2a and occurs twelve clock pulses after the transition reaches the first tap. The output pulses from gates 89 and 90 are routed via AND gates 91-94 and OR gates 95-96 to the decoder output connections D1 and D2. The AND gates 91-94 are responsive to a SGN signal which is developed by the transition detector and indicates whether the input transition is positive or negative going. If the SGN signal is high (positive input transition) AND gates 91 and 93 are enabled and AND gates 92 and 94 are disabled. The pulses generated by AND gates 89 and 90 are respectively passed to decoder terminals D1 and D2. Conversely, if the SGN signal is low, the pulses produced by AND gates 89 and 90 are respectively passed to decoder terminals D2 and D1. With respect to the FIG. 5 weighting circuit the latter case applies the weighted signals W2 from element 71 then the weighted sample W1 from element 70 to the output connection 80. In the former case (SGN high) the weighted signals W2 and W1 are applied to terminal 80 in the reverse order.

The FIG. 6 decoder circuit is intended to be illustrative of only one embodiment. Those skilled in the art of circuit design will readily be able to create alternate designs to generate the desired decoding signals. Depending on the type of transition detector implemented and the particular decoding circuit used, it may be necessary to interpose delay elements in the serial circuit chain between the transition detector and the switch 52 to provide for the difference between the time the transition enters the filter and the time the artifact appears at the filter output.

FIG. 7 is a transition detector for use in detecting vertical detail transitions in a combed chrominance video signal. Nominally, the frequency spectrum of the combed chrominance signal extends from 0 to approximately 4.2 MHz. The vertical detail is primarily contained in the lower portion of the spectrum. The chrominance component is centered about a carrier at 3.58 MHz. For the system wherein the FIR filter being compensated is a low pass filter designed to attenuate the chrominance component, chrominance input transitions are of no moment as they will be inherently rejected by the filter. Thus, the transition detector should be designed to ignore chrominance transitions, and should produce transition trigger signals only for the lower frequency vertical detail signal. The transition detector of FIG. 7 accomplishes this by incorporating a 3.58 MHz notch filter. This filter is itself designed as an FIR filter and includes the one sample delay stages 88-91, tap weighting circuits 85-87 and the summing circuit 92. The frequency response at the output of the summing circuit 92 is attenuated more than 80 db at 3.58 MHz and the response is down more than 20 db at 0.6 MHz on either side of the 3.58 MHz center frequency. The output signal samples from summing circuit 92 are actually the weighted sums of three distinct input samples, each of which are separated by two samples. The sums are in general averages of the input signal over five samples.

The output samples from summing circuit 92 are applied to one input of subtraction circuit 94 and to a one sample delay stage 93. The output of delay stage 93 is applied as the subtrahend of subtraction circuit 94. Successive sum samples from circuit 92 are subtracted one from the other in circuit 94. The sample differences from subtraction circuit 94 are applied to a comparator 95, a latch 97 and a sign detector 98. The comparator 95 compares the differences against a threshold value provided by element 96, and if the difference exceeds the threshold value, generates a trigger signal on connection 99. The threshold value is selected so that the compensation system operates only for those transitions which have amplitudes sufficient to induce objectionable over/undershoots.

The trigger signal is coupled to the decoder circuit (e.g. 64) and also serves to latch the differences in circuit 97. The output of the latch is applied to the weighting circuit 65. The sign detector serves to determine if the transition is positive or negative going. Note if the subtractor performs 2's complement arithmetic, the sign circuit need only invert the most significant bit of the difference which bit is a 0 for positive values and a 1 for negative values. The inverted or complemented MSB of the sample difference will then serve as the sign (SGN) signal.

The difference signals produced by the subtraction circuit do not equal the transition value since the sum samples are averages over five samples. For the circuit of FIG. 7, the difference values are ¼ the value of the transition over four samples. However, this factor can be accounted for in the weighting values chosen for the weighting elements in the weighting circuits 65 and 65'.

The embodiments discussed thus far have involved cancelling unwanted artifacts in the filtered samples produced at the output of the FIR filter. With a little reflection, it will be recognized that the offending artifact during particular time segments results from the contribution of a single tap weight within the filter. Therefore, it is possible to correct the artifacts by successively altering ones of the tap weighting circuits (18, 20, 22, 26, 28 and 30 in FIG. 1) while the input signal transition is traversing the filter.

FIG. 8 shows a weighting circuit capable of having its coefficient modified. The weighting circuit includes a multiplier 110 having a first input 109 for connection to a filter register tap and a second input 111 for application of the weighting coefficient. Multiplier 110 may be, for example, of the tree array type or the shift and add type. The coefficient input 111 is coupled to a coefficient table 112 (digital realization) which contains two or more coefficients. The particular one of the coefficients contained in the table 112 selected for application to the multiplier 110 is determined by a decode (Di) input 113. The decode signal may be generated by a circuit such as the one described with reference to FIG. 6. Nominally, the tables 112 need contain only two coefficients—one for normal operation of the filter and the other for correcting transition induced artifacts. Consider the FIG. 1 filter having weighting circuits 20 and 26 replaced with the type shown in FIG. 8. The coefficient table for circuit 20 would be designed to contain a zero value coefficient and a −5/64 value coefficient. The coefficient table for circuit 26 would contain a 4/16 value coefficient and a 5/16 value coefficient. By switching the coefficient values at the appropriate times, the most offending artifacts (times T5–T9 and T13–T17) produced by a positive going transition can be substantially reduced.

Referring back to FIG. 2d (the low pass output response of the FIG. 1 filter to a large stepped pulse), the undershoot at times T5–T9 is due to the contribution of the weighting circuit 20 (operating with a weighting coefficient of −5/64). If from time T5 to T9 the circuit 20 coefficient is changed to zero, the output response will remain at the 1/64th value shown in the waveform. Thus, by changing the circuit 20 coefficient to zero for this time segment, the negative undershoot is eliminated. However, exact compensation is not realized since the output value should equal zero during this interval and not the 1/64th value contributed by the weighting circuit 18.

At time T13, the transition enters weighting circuit 26 and its contribution to the output sum produces an output value in excess of the desired value by 1/16 of the input transition. This 1/16th overshoot can be prevented by reducing the circuit 26 coefficient from its normal value of 5/16 to 4/16 for the interval T13 to T17.

Decoding pulses to effect the changes to weighting circuits 20 and 26 for preventing the artifacts due to positive input transitions during the intervals T5–T9 and T13–T17 may be respectively obtained from the output connections of AND gates 91 and 93 of the FIG. 6 circuitry.

Artifacts due to negative going transitions may be reduced by adjusting the coefficients of weighting circuits 22 and 28 in a similar fashion to the foregoing discussion. It will be readily appreciated that more of the weighting circuits may have their coefficient values selectively modified to accomplish more exacting output artifact cancellation.

Several comments are in order at this point. The immediately foregoing example of weighting coefficient modification serves only for the purpose of illustration. In practice, for example, the coefficient of circuit 20 will not be changed to a zero value. Normally the input signal will have some average non zero value and the transitions will depart positively or negatively from this value. If on the occurrence of a transition the coefficient of weighting circuit 20, for example, is reduced to zero, this will impart a positive increment of 5/64 of the average value to the filter output sample which positive increment may be more objectionable than the transition induced undershoot. The value of the coefficient modification must be determined in accordance with the threshold value of the transition detector. If the transition detector is designed to detect transitions which are substantially equal to ½ the dynamic range of the signal (assuming the average input value is at the midpoint of the dynamic range) then the coefficient should be approximately halved for transition artifact correction. If the threshold is less than one half the dynamic range the coefficient change should be greater than one half the coefficient value and should be determined based, for example, on a statistical average of the amplitudes of the transitions normally expected to occur so as to generate the largest percentage of nearly correct output samples when a signal transition is in the filter. Similarly, all of the weighting circuits in the filter which are selectively modified responsive to an input transition will have their modified coefficient values determined on this basis.

In order to simplify the decoder design, and the filter design, for filters having a symmetrical tap weighting structure, the pair of symmetrical taps of which one is producing the offending artifact, may both be simultaneously and equally modified without substantially adversely affecting the filter frequency response characteristic (at least in the case of the chrominance filter of FIG. 1).

The invention has been described primarily with reference to a low pass FIR filter but is not limited to this application. The invention has similar application to bandpass and high pass FIR filters for eliminating artifacts as well as infinite impulse response, (IIR) filters.

What is claimed is:

1. A sampled data filter system comprising:

a sampled data filter having input and output terminals, and susceptible to producing sequences of undesirable output signal artifacts immediately preceding and following output signal transitions in response to particular transitions of signal applied to the input terminal.

means responsive to said particular transitions for generating a control signal;

means cooperating with said sampled data filter, and responsive to said control signal for producing a further sequence of signals; and means for applying said further sequence of signals to said filter to successively substantially reduce said undesirable output signal artifacts in the output signal sequences of said sampled data filter.

2. A sampled data filter system comprising:

a signal input terminal;

a first plurality of cascaded delay elements, a first of which has an input terminal coupled to said signal input terminal for applying signal to be filtered;

a first plurality of weighting elements having respective input terminals coupled respectively to ones of said delay elements for producing weighted replicas of signal samples in said ones of the delay elements;

first means coupled to said first plurality of weighting elements for generating an output signal corresponding to the sums of said weighted samples, said weighting elements and said first means susceptible of producing undesirable artifacts immediately preceding and following output signal transitions corresponding to input signal transitions exceeding a predetermined amplitude;

second means coupled to said signal input terminal for generating a compensating signal containing artifacts complementary to said undesirable artifacts in said output signal generated by said first means;

third means responsive to input signal applied to said signal input terminal for detecting transitions in the input signal exceeding a predetermined value, and generating a trigger signal in response to said transitions; and fourth means responsive to said trigger signal and said compensating signal for selectively combining said compensating signal with said first means output signal to reduce said undesirable signal artifacts at transitions in said output signal corresponding to transitions in said input signal producing said trigger signal.

3. The system set forth in claim 2 wherein said second means comprises a sampled data filter having a complementary frequency response characteristic to said first means output signal.

4. The system set forth in claim 3 wherein the second means further includes a band reject sampled data filter serially connected with said sampled data filter.

5. The system set forth in claim 2 wherein said third means comprises:

means for successively subtracting successive input signal samples to generate the amplitude differences between adjacent input signal samples;

a source of reference signal;

comparator means responsive to said amplitude differences and said reference signal for generating said trigger signal whenever the amplitude difference value exceeds the reference value.

6. The system set forth in claim 5 wherein said third means further includes:

means responsive to the amplitude differences for determining the direction (sign) of the transition.

7. The system set forth in claim 6 wherein said third means further includes:

latch circuitry responsive to said trigger signal and said amplitude differences for storing the amplitude differences giving rise to a respective trigger signal.

8. The system set forth in claim 6 wherein the second means comprises:

a second plurality of weighting circuits;

means for coupling the latched amplitude difference from said second means to said third plurality of weighting circuits, wherein the weighting circuits generate a plurality of signal values respectively corresponding to particular artifacts in said output sequence; and gating means responsive to said fourth means for sequentially selecting weighted signals from said second plurality of weighting circuits.

9. The system set forth in claim 5 wherein the second means comprises:

a second plurality of weighting circuits;

means for coupling the latched amplitude difference from said second means to said third plurality of weighting circuits, wherein the weighting circuits generate a plurality of signal values respectively corresponding to particular artifacts in said output sequence; and gating means responsive to said fourth means for sequentially selecting weighted signals from said second plurality of weighting circuits.

10. A sampled data filter system comprising:

a first plurality of cascaded delay elements, a first of which has an input terminal for applying signal to be filtered;

a first plurality of weighting elements having respective input terminals coupled respectively to ones of said delay elements for producing weighted replicas of signal samples in said ones of the delay elements;

first means coupled to said first plurality of weighting elements for generating an output signal corresponding to the sums of said weighted samples, said first means being susceptible of producing a sequence of undesirable signal artifacts preceding and following output signal transitions when input signal transitions course through said plurality of delay stages;

second means responsive to input signal applied to said plurality of delay elements for detecting transitions in the input signal that exceed a predetermined value and generating a trigger signal responsive thereto;

third means responsive to said trigger signals for generating a sequence of control signals coinciding with said output signal artifacts; and fourth means responsive to said control signals for sequentially modifying the weighting values of ones of said first plurality of weighting circuits to reduce said undesirable signal artifacts in said output signal.

* * * * *